United States Patent [19]
Horna

[11] 4,321,686
[45] Mar. 23, 1982

[54] CORRECTION PROCESSOR OF SELF-ADAPTIVE FILTERS

[75] Inventor: Otakar A. Horna, Bethesda, Md.

[73] Assignee: Communications Satellite Corporation, Washington, D.C.

[21] Appl. No.: 114,918

[22] Filed: Jan. 24, 1980

[51] Int. Cl.³ .................... G06F 15/31; H04B 3/22
[52] U.S. Cl. ........................... 364/724; 179/170.2
[58] Field of Search .................... 364/724, 825; 179/170.2, 170.8; 333/18

[56] References Cited

U.S. PATENT DOCUMENTS

| | | | |
|---|---|---|---|
| 3,588,385 | 6/1971 | Moye | 179/170.2 |
| 3,659,229 | 4/1972 | Milton | 333/18 |
| 3,732,410 | 5/1973 | Mackechnie | 179/170.2 X |
| 3,735,055 | 5/1973 | Thomas | 179/170.2 |
| 4,006,352 | 2/1977 | Sato | 364/724 |
| 4,144,417 | 3/1979 | Oshima et al. | 179/170.2 |

Primary Examiner—Jerry Smith
Attorney, Agent, or Firm—Sughrue, Mion, Zinn, Macpeak and Seas

[57] ABSTRACT

A self adaptive filter effects a distribution of the power density spectrum of two signals which are correlated in the filter adaptation process so that the filter can provide optimum adaption for a wide range of input signals. The power density distribution is provided by multiplying the operands of the correlator by a random sequence of binary numbers before applying the operands to the correlator. The multiplication effects a decorrelation of the operand input signals.

14 Claims, 3 Drawing Figures

CORRECTION PROCESSOR OF SELF-ADAPTIVE FILTERS

BACKGROUND OF THE INVENTION

In recent years self-adaptive filters have become an important tool in signal processing. For example, when used for echo cancellation, they can often dramatically improve the quality of long distance telephone communications. The basic theory of the self-adapting finite impulse response (AFIR) filter, which simulates or identifies an unknown system has been published by S. J. Campanella et al., "Analysis of an Adaptive Impulse Response Echo Canceller", *COMSAT Technical Review,* Vol. 2, No. 1, Spring 1972, pp. 1–36; and B. Widrow et al., "Stationary and Nonstationary Learning Characteristic of the LMS Adaptive Filter", *Proc. IEEE,* Vol. 64, No. 8, August 1976, pp. 1151–1162. The use of AFIR filters for echo cancellation has been described in the papers of Campanella et al, above, and O. A. Horna, "Echo Canceller Utilizing Pseudo-Logarithmic Coding", *NTC '77 Conference Record,* Vol. 1, pp. 04:7-1-04:7-8; and "Identification Algorithm for Adaptive Filters", *COMSAT Technical Review,* Vol. 8, No. 2, Fall 1978, pp. 331-351.

The self adaptive filters used for echo cancellation produce optimum echo cancellation if and only if the input signal is a sequence of random samples (i.e., a Poisson wave). Problems arise when the successive input signals are highly correlated as in the case of speech and video signals, for example, and optimum adaptation cannot be achieved.

SUMMARY OF THE INVENTION

The subject invention avoids the problems associated with the reception of highly correlated signals by providing a technique for decorrelating the system input signal and a generated error signal with two statistically independent random binary sequences.

The subject invention further provides a technique for decorrelating the system input signal and a generated error signal with two statistically independent random binary sequences which are generated from a single random number generator.

The subject invention further provides a technique for decorrelating the system input signal and a generated error signal by multiplying said signals by two statistically independent random binary sequences, and for temporarily halting the adaptation process by multiplying said signals by a predetermined binary sequence.

PRIOR ART

Figure 1:
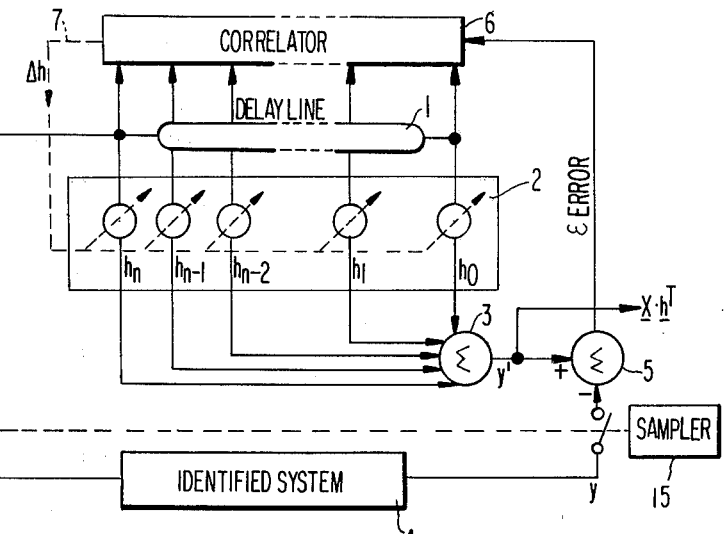
FIG. 1 is a schematic illustration of a self-adaptive filter which may be employed for echo cancellation.

FIG. 1 is a block diagram of the basic adaptive filter. The AFIR filter is composed of a delay line 1 with n taps. Each tap is connected to a circuit 2 with adjustable gains $h_o, h_l, \ldots, h_n$. The outputs of the gain circuits are added in a summation circuit 3.

The unkown or identified system 4 is connected in parallel with the AFIR filter and its input signal X and output signal y are synchronously sampled by a sampler 15. The samples of X are fed into delay line 1 which may be comprised of a well-known CCD device, or if X is in digital form, line 1 may be comprised of a multi-bit shift register. The samples of y are subtracted from the output y' of the AFIR filter. The sample y' at the jth sampling period is given by the expression:

$$y_j' = \sum_{i=0}^{n} h_i x_{j+i} = X \cdot h^T \quad (1)$$

where $x_{j+i}$ represents the sample x at time j appearing at tap i of the delay line 1, h is the coefficient vector $h = (h_o \ldots h_n)$, and $h^T$ is its transpose.

The output $y_j'$ is substracted at subtractor 5 from the sampled output $y_j$ of the identified system 4 to provide the error signal $$E_j = y_j' - y_j. \quad (2)$$

The error signal $E_j$ is fed into the correlator 6, where corrections $\Delta h_i$ for every coefficient $h_i$ are computed from the error $E_j$ and from samples of X. The correction signals are delivered to the adjustable gain circuit 2 via line 7. The formula for $\Delta h_i$ as derived in the Campanella et al and Horna references cited above, for the jth sampling period is:

$$\Delta h_{i+j} = \frac{x_{i+j} E_j}{\Sigma_i (x_{i+j})^2} \quad (3)$$

It can be shown that if and only if the input signal is a sequence of random samples (e.g., a Poisson wave), the filter will converge to the optimal coefficient vector h, which is equivalent to the sampled impulse response of the identified system 4.

When the successive input signal samples $x_{i+j}$ are highly correlated as in the case of speech and video signals, for example, the optimal response vector h cannot be found, especially when the AFIR filter has several hundred taps as in the case of telephone circuit echo cancellers. This can be explained in terms of the frequency domain: The impulse response of a system is a response to a signal with a flat power density spectrum; neither speech nor video signals have a continuous frequency spectrum as is well known. If some frequencies in the input signal X are missing, which is evidenced by a high correlation of successive signal samples $x_{i+j}$ and $x_{i+j+l}$, then the system is obviously unable to find the proper response for these missing frequencies.

Figure 2:
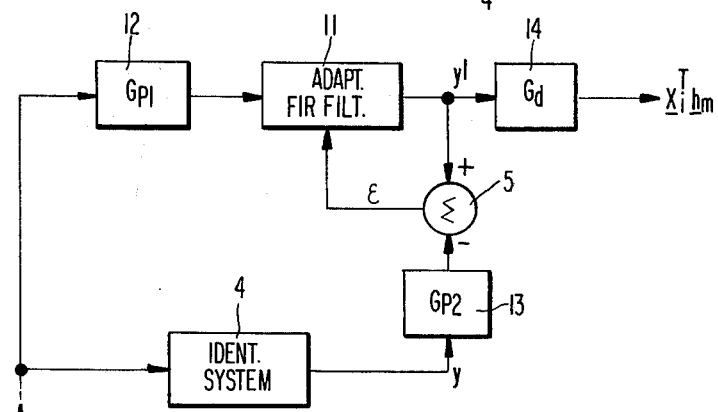
FIG. 2 is an illustration of a prior art technique for improving the performance of the adaptive filter.

FIG. 2 illustrates a technique for improving the performance of the AFIR filter when driven by highly correlated signals (speech, TV). R. Wehrman in "State of Investigation . . .", Third International Conference on Digital Satellite Communications, Kyoto, Japan, 1975, suggests the use of pre-emphasis filters 12 and 13 to make the power density spectrum of the speech entering the AFIR filter 11 flatter and the use of a de-emphasis filter 14 at the output of the AFIR filter to restore the original frequency density spectrum, as shown in FIG. 2. This method can improve the performance of the AFIR filter, but requires careful matching of the characteristics of the pre-emphasis filters 12 and 13 and de-emphasis filters 14 so that the transmission characteristics are $$G_{p1} = G_{p2} = \frac{1}{G_d} \quad (4)$$

In addition, this method causes the system to be sensitive to overload, especially when working with speech signals. At its higher frequency limit, speech has very low power but high peak amplitudes which are highly amplified by pre-emphasis filters 12 and 13.

Another method suggested in the above cited Campanella et al article, is to select for the correction process according to equation (3) only those samples $x_{i+j}$ which have higher than average amplitudes. Such selection partially decorrelates the input signal X. Although this method represents a definite improvement of the AFIR filter, the adaptation is still slow or even erroneous when a very highly correlated continuous signal is present, e.g., a single sine wave or similar tone such as singing.

DETAILED DESCRIPTION OF THE INVENTION

Figure 3:
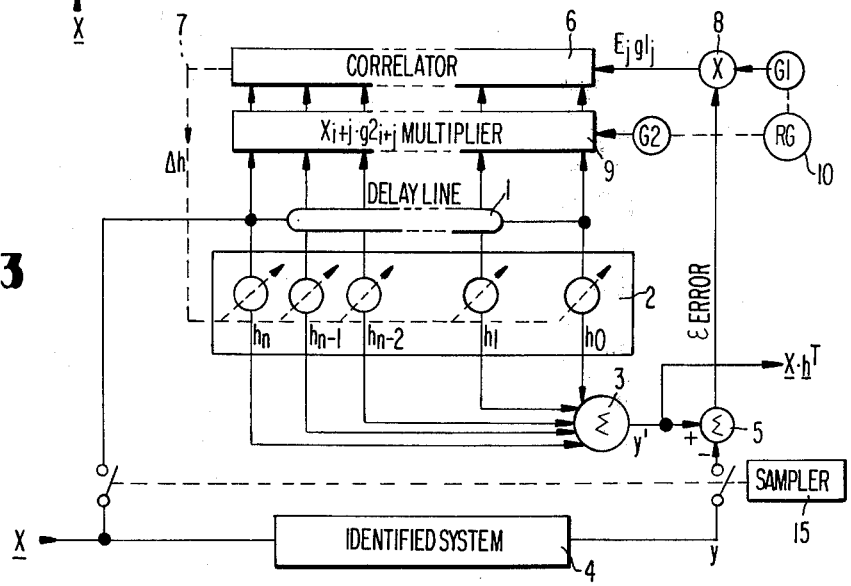
FIG. 3 is a schematic illustration of the decorrelating self-adaptive filter in accordance with the present invention.

The preferred embodiment of the present invention is illustrated in FIG. 3. The input signal X is completely decorrelated in multiplier 9, while the error signal $E_j$ is decorrelated in multipler 8 before application to correlator 6 without infuencing the output y' of the AFIR filter. Once every sampling period j, a single random binary number $g1_j$ from generator G1 is applied to multiplier 8 to multiply error signal $E_j$ by $g1_j$ each sampling period. The generator G2 on the other hand produces a random sequence of binary numbers $$G2_j = [g2_{o+j} \ldots g2_{i+j} \ldots g2_{n+l+j}] \quad (5)$$

where $g2_{i+j}$ is the random binary bit, from generator G2, which appears as the multiplier adjacent the ith tap of delay line 1 at time j. The random g2 bits are shifted through the multiplier, which may comprise a shift register and analog gates for an analog delay line. Once each sampling period, the random binary number $g2_{i+j}$ multiplies the input sample $x_{i+j}$ in multiplier 9 which acts to pass either the sample $x_i$ or a zero level depending upon the value of the multiplier $g2_{i+j}$. In the case of a digital delay line 1, the multiplier 9 may alternatively add a 1 or 0 bit to each delayed sample, depending upon the value of the number $g2_{i+j}$, rather than actually performing a multiplication by 1 or 0. In this case, correlator 6 will treat all words having a zero bit added thereto as having a zero level. At the end of each sampling period j the random binary sequence $G2_j$ is shifted in multiplier 9 so that $g2_i$ at sampling period j is equal to $g2_{i+l}$ at sampling period j+l. Therefore, the signal entering the correlator 6 from multiplier 9 during the j sampling period is $$X' = [X_{o+j}g2_{o+j} \ldots x_{i+j}g2_{i+j} \ldots x_{n+j}g2_{n+j}] \quad (6)$$

Because the sequence G2 is random, the output of multiplier 9 is also a random sequence of samples of signal X. If both products are substituted into equation (3), the expression for correction is $$\Delta h_i = g1_j g2_{i+j} \frac{x_{i+j}E_j}{\Sigma_i(x_{i+j})^2} \quad (7)$$

It is seen that coefficients $h_i$ are corrected if and only if $g1_j g2_{i+j} = 1$. Then, however, correction $\Delta h_i$ according to equation (7) is the same as that according to equation (3) so that the stability and convergence of the AFIR filter are not affected by G1 and G2; only the number of corrections during a certain period of time is affected since the coefficients are not corrected unless $g1_j = g2_{i+j} = 1$.

It can be seen that even if coefficients $g1_j$ and $g2_{i+j}$ are selected from the same random sequence, the statistical independence of G1 and G2 will be maintained. Therefore, G1 and G2 can be combined into one random number generator 10 which generates a new coefficient 0 or 1 every sampling period. This new coefficient is used as $g1_j$ and also shifted into multiplier 9, where it becomes $g2_{o+j}$; all the coefficients $g2_{i+j}$ are shifted at each sampling period and the coefficient $g2_n$ is deleted at each sampling period.

Because the correction process is stopped when either $g1_j$ or $g2_{i+j}$ equals zero, generator 10 can be combined with other internal functions of the AFIR filter. Therefore, if a certain event occurs, generator 10 can be instructed to generate, instead of a random binary sequence, all zeros which will immediately "freeze" the adjustment of coefficients $h_i$ and all corrections $\Delta h_i = 0$, from equation (7).

The following is a list of conditions which usually necessitate stopping the filter correction process:

(1) Signal X drops below the resolution level of the AFIR filter, e.g., below the background or quantization noise of the system;

(2) a continuous sine wave signal is at the input; this signal can distort or "contaminate" the stored impulse response h;

(3) an overload exists in the input or output; intermodulation products can distort response h;

(4) the error $E_j$ is smaller than the resolution level of the system; continuation of the correction process will not improve the precision of the AFIR filter's simulation of the identified system 4, but will increase the operational noise; and (5) another signal is injected into the AFIR filter input; this condition occurs during the so-called "double talk" condition when the AFIR filter is used for echo cancellation in a 4-wire long distance telephone circuit.

Many other conditions can be used to generate $g_{1j} = 0$ to stop the adaptive process (depending on the use of the adaptive system). Some of these conditions are discussed in copending application Ser. No. 72,813 "Improved Double Talk for Echo Cancellers", by O. A. Horna.

Various changes, additions and omissions of elements may be made within scope and spirit of this invention and it is to be understood that the invention is not limited to specific details, examples and preferred embodiments shown and described herein.

I claim:

1. An adaptive filter system for receiving (i) an input signal to a system to be characterized and (ii) an output signal from said system to be characterized for producing a replica of said output signal, comprising:
   (a) delay line means for receiving said input signal and for providing a plurality of delayed outputs of said input signal;
   (b) a plurality of adjustable gain control means receiving said plurality of delayed outputs to provide a plurality of adjusted delayed outputs;

(c) means for summing said plurality of adjusted delayed outputs to provide said replica of said output signal;
(d) means for producing the difference between said replica of said output signal and said output signal to produce an error signal;
(e) means for providing random numbers;
(f) first multiplication means for multiplying said error signal by said random numbers to produce a first operand;
(g) second multiplier means for multiplying said plurality of adjusted delayed outputs by said random numbers to produce a second operand; and
(h) means for correlating said first and second operands to provide a plurality of control outputs, whereby said plurality of adjustable gain control means are controlled by said control outputs.

2. The filter system of claim 1 wherein said means for providing random numbers provides a random sequence of numbers, each number in said sequence provided to multiply a single delayed output of said delay line means in said second multiplier means.

3. The filter system of claim 2 wherein said delay line means provides a plurality of adjacent delayed outputs, and a single number in said random sequence is provided to multiply said error signal in said first multiplier means.

4. The filter system of claim 3 wherein said sequence of random numbers is shifted through said second multiplier means such that a random number in said sequence which multiplies a delayed output at one point in time multiplies an adjacent delayed output at a later point in time.

5. The filter system of claim 3 wherein said random numbers are binary.

6. The filter system of claim 5 wherein each said plurality of control outputs controls the gain of a single associated adjustable gain control means, only when (i) said single number in said random sequence provided to multiply said error signal and (ii) said number provided to multiply the delayed output associated with said associated adjustable gain control means are both 1.

7. In an adaptive filter connected to a system to be characterized for receiving an input signal to said system and an output signal from said system for producing a replica of said output signal; said adaptive filter having a delay line for receiving said input signal to provide delayed outputs, adjustable gain control means for receiving said delayed outputs to provide adjusted outputs, means for summing said adjusted outputs to produce said replica, means for producing the difference between said replica and said output signal to provide an error signal, means responsive to said error signal and said delayed outputs for providing a correlation function, said correlation function providing control signals to said adjustable gain control means;
the process for distributing the power density spectrum of signals entering said means for providing said correlation function comprising:
(i) decorrelating said delayed outputs and (ii) decorrelating said error signal.

8. The process of claim 7 wherein said decorrelating of said delayed outputs and of said error signal is achieved by multiplying said delayed outputs and error signals by a random sequence of numbers.

9. The process of claim 8 wherein said delayed outputs and said error signals are multiplied by the same random sequence of numbers.

10. In an adaptive filter connected to a system to be characterized for receiving an input signal X to said system and an output signal y from said system for producing a replica y' of said output signal; said adaptive filter having a delay line for receiving said input signal X to provide a plurality of delayed outputs $x_{i+j}$ where i corresponds to one of said plurality of delayed outputs and j represents the jth sampling period, adjustable gain control means for receiving said delayed outputs $x_{i+j}$ to provide adjusted outputs, means for summing said adjusted outputs to produce said replica y', means for producing the difference between said replica y' and said output signal y to provide an error signal $E_j$ at each sampling period j, means responsive to said error signal $E_j$ and said delayed outputs $x_{i+j}$ for providing a correlation function, said correlation function providing control signals $\Delta h_{i+j}$ to said adjustable gain control means;
the improvement comprising:
means for generating a random number $g1_j$ at the jth sampling period;
means for generating a random sequence of numbers $g2_{i+j}$ for each of said plurality of delayed outputs $x_{i+j}$ at the jth sampling period;
means to multiply said random number $g1_j$ by said error signal $E_j$ to produce a first operand $E_j g1_j$;
means to multiply said plurality of delayed outputs $x_{i+j}$ by said random sequence of numbers $g2_{i+j}$ to provide a second operand $x_{i+j} g2_{i+j}$ for each of said plurality of delayed outputs at the jth sampling period;
wherein said means to provide said correlator function produces said control signal $\Delta h_{i+j}$ according to the equation $$\Delta h_i = [g1_j g2_{i+j}] \frac{x_{i+j} E_j}{\Sigma_i (x_{i+j})^2}$$

11. The adaptive filter of claim 10 wherein said random number $g1_j$ and said random sequence of numbers $g2_{i+j}$ are binary.

12. The adaptive filter of claims 10 or 11 wherein $g1_j$ and $g2_{i+j}$ are generated from the same random number generator.

13. The adaptive filter of claim 12 wherein said means to multiply said plurality of delayed outputs $X_{i+j}$ by said random sequence of number $g2_{i+j}$ shifts said random sequence of numbers at each sampling period j such that $g2_i$ at the jth sampling period is equal to $g2_{i+1}$ at the jth+1 sampling period.

14. The adaptive filter of claim 11 wherein at least one of said random number $g1_j$ and said random sequence of numbers $g2_{i+j}$ may be chosen to halt adjustment of said adjustable gain control means.

* * * * *

UNITED STATES PATENT AND TRADEMARK OFFICE
CERTIFICATE OF CORRECTION

PATENT NO. : 4,321,686

DATED : March 23, 1982

INVENTOR(S) : Otakar A. Horna

It is certified that error appears in the above—identified patent and that said Letters Patent is hereby corrected as shown below:

Col. 2, line 51, change "+1'," to --+1,--.

Col. 3, line 27, delete "infuencing" and insert --influencing--.

Col. 4, line 7, change "gℓj" to --glj--.

Signed and Sealed this

Twenty-fifth Day of May 1982

[SEAL]

Attest:

Attesting Officer

GERALD J. MOSSINGHOFF

Commissioner of Patents and Trademarks